US010691205B1

(12) United States Patent
Schick

(10) Patent No.: US 10,691,205 B1
(45) Date of Patent: Jun. 23, 2020

(54) TAP DEVICE WITH DYNAMICALLY SWITCHABLE MODES

(71) Applicant: TAP SYSTEMS INC., Los Angeles, CA (US)

(72) Inventor: David B. Schick, Los Angeles, CA (US)

(73) Assignee: Tap Systems Inc., Los Angeles, CA (US)

( * ) Notice: Subject to any disclaimer, the term of this patent is extended or adjusted under 35 U.S.C. 154(b) by 0 days.

(21) Appl. No.: 16/101,863

(22) Filed: Aug. 13, 2018

Related U.S. Application Data

(60) Provisional application No. 62/551,339, filed on Aug. 29, 2017.

(51) Int. Cl.
| | | |
|---|---|---|
| *G09G 5/00* | (2006.01) | |
| *G06F 3/01* | (2006.01) | |
| *H03K 17/94* | (2006.01) | |
| *G06F 3/042* | (2006.01) | |
| *G06F 3/023* | (2006.01) | |
| *G06F 3/0354* | (2013.01) | |

(52) U.S. Cl.
CPC ............ *G06F 3/014* (2013.01); *G06F 3/0235* (2013.01); *G06F 3/0236* (2013.01); *G06F 3/03547* (2013.01); *G06F 3/0425* (2013.01); *H03K 17/941* (2013.01)

(58) Field of Classification Search
CPC ........ G06F 3/0235; G06F 3/0236; G06F 3/03; G06F 3/03547; G06F 3/042; G06F 2203/0331
See application file for complete search history.

(56) References Cited

U.S. PATENT DOCUMENTS

| 3,022,878 A | 2/1962 | Seibel et al. |
|---|---|---|
| 5,281,966 A | 1/1994 | Walsh |

(Continued)

FOREIGN PATENT DOCUMENTS

CN 103 995 621 A 8/2014

OTHER PUBLICATIONS

Int'l Search Report and Written Opinion issued in connection with Int'l Appl'n No. PCT/US2016/020048 dated May 24, 2016 (12 pages).

(Continued)

*Primary Examiner* — Vijay Shankar
(74) *Attorney, Agent, or Firm* — Venable LLP

(57) ABSTRACT

A wearable data entry system includes a plurality of sensors corresponding to respective fingers of a user's hand, which are worn on the user's hand and generate respective signals representative of contact by one or more fingers against an arbitrary surface. A processor detects which fingers contacted the arbitrary surface by analyzing the signals during a data collection period and generates data indicating which fingers contacted the arbitrary surface during the data collection period, and a transmitter transmits information corresponding to the fingers that contacted the arbitrary surface to an external device, using a predetermined protocol. The wearable data entry system includes a memory that stores a mode value, and at least one of (i) the detecting by the processor and (ii) the predetermined protocol used by the transmitter, depends on the stored mode value.

20 Claims, 7 Drawing Sheets

(56) References Cited

U.S. PATENT DOCUMENTS

| | | | |
|---|---|---|---|
| 6,380,923 B1* | 4/2002 | Fukumoto | G06F 1/163 341/22 |
| 2002/0009972 A1 | 1/2002 | Amento et al. | |
| 2004/0263473 A1 | 12/2004 | Cho et al. | |
| 2009/0005699 A1 | 1/2009 | Sakurai et al. | |
| 2009/0326406 A1 | 12/2009 | Tan et al. | |
| 2011/0202306 A1* | 8/2011 | Eng | A61F 4/00 702/150 |
| 2014/0098018 A1 | 4/2014 | Kim et al. | |
| 2014/0258864 A1 | 9/2014 | Shenoy et al. | |
| 2015/0370326 A1 | 12/2015 | Chapeskie et al. | |
| 2016/0124524 A1 | 5/2016 | Zhao et al. | |

OTHER PUBLICATIONS

C.K. Sunith, "Virtual Keyboards Typing Out of Thin Air", Electronics For You, Apr. 2003, pp. 38-39.

C. Mehring et al., "KITTY: Keyboard Independent Touch Typing in VR", Virtual Reality, 2004. Proceedings. IEEE, Mar. 27-31, 2004, pp. 243-244.

Coroflot, Optical Keyboard Keyset, www.coroflot.com/erikcampbell/Optical-Keyboard-Keyset (last visited Jul. 12, 2016).

MicroSoft, Microwriter, research.microsoft.com/en-us/um/people/bibuxton/buxtoncollection/detail.aspx?id=5 (last visited Jul. 12, 2016).

Cykey homepage, www.cykey.co.uk/ (last visited Jul. 12, 2016).

MicroSoft, Chord Keyboard, research.microsoft.com/en-us/um/people/bibuxton/buxtoncollection/type.aspx?t=Chord%20Keyboard (last visited Jul. 12, 2016).

"TipTapSpeech now for the iPhone and iPad", valerielandau.wordpress.com/2010/04/03/tiptapspeech-now-for-the-iphone-and-ipad/ (last visited Jul. 12, 2016).

"Father of the Keyset", dougengelbart.org/firsts/keyset.html (last visited Jul. 12, 2016).

"PMD and Infineon to enable tiny integrated 3D depth cameras (hands-on)", www.engadget.com/2013/06/06/pmd-infineon-camboard-pico-s-3d-depth-camera/ (last visited Jul. 26, 2016).

"The Virtual Keyboard may soon be a reality", phys.org/news/2014-05-virtual-keyboard-reality-video.html (last visited Jul. 26, 2016).

"Tiki'Labs virtual keyboard for iPhone takes shot at Swype, on-handed typing wars commence", Paul Miller, Dec. 18, 2009, www.engadget.com/2009/12/18/tikilabs-virtual-keyboard-for-iphone-takes-shot-at-swype-one-h/ (last visited Jul. 12, 2016).

"Motion-sensing Devices in the Assistive Technology Arena"—lecture slides, Owen R. Edwards, Jan. 22, 2010, web.stanford.edu/class/engr110/2010/lecture03b.html (last accessed Aug. 19, 2016).

"WearaBraille", Joshua Miele, www.ski.org/project/wearabraille (last accessed Aug. 10, 2016).

"WearaBraille, a virtual wireless Braille keyboard, with an iPhone and VoiceOver", Joshua Miele & Owen Edwards, National Rehabilitation Information Center, 2011, www.naric.com/?q=en/content/wearabraille-virtual-wireless-braille-keyboard-iphone-and-voiceover (last accessed May 31, 2017).

"WearaBraille, a virtual wireless Braille keyboard, with an Android phone", Joshua Miele, YouTube, Mar. 23, 2011, www.youtube.com/watch?v=oKj6BRCauOM (last accessed May 31, 2017).

* cited by examiner

TAP DEVICE WITH DYNAMICALLY SWITCHABLE MODES

CROSS-REFERENCE TO RELATED APPLICATION

This application claims priority to U.S. Provisional Application No. 62/551,339, filed on Aug. 29, 2017.

BACKGROUND

Example aspects described herein relate generally to chorded data entry systems, and more particularly to a chorded data entry system having dynamically switchable modes.

DESCRIPTION OF RELATED ART

A chorded data entry device is an input device that allows a user to enter characters or commands that are formed by pressing several keys together, like playing a "chord" on a piano. The large number of combinations available from a small number of keys allows text or commands to be entered with one hand, leaving the other hand free. Such devices can be in the form of a chorded data entry device as described, for example, in U.S. Patent Publication No. 2016/0259407, which is incorporated herein by reference. Such a chorded data entry device collects mechanical or optical information each time one or more fingers taps an arbitrary surface and that information is analyzed to determine which finger or combination of fingers tapped the surface.

Generally speaking, data entry devices can be used for a variety of different applications, such as language input, music production, and gaming. However, such input devices are typically configured and/or optimized for only one of those applications at a time. For example, depending on the application, the data entry device may need to detect the tap signals differently (e.g., receive tap signals from a different number of fingers and/or for a different collection period), decode the detected finger combinations differently (e.g., map a given detected finger combination into a different character or command depending on the application), and/or transmit information to a host device (i.e., the device for which the entered data is intended).

When the detection, decoding, and/or transmission by the data entry device is configured and/or optimized for a particular application, that configuration and/or optimization can interfere with the optimal operation of the device for other applications, or it may preclude the use of the data entry device for certain other applications altogether. Consequently, the utility of such a data entry device is reduced for applications for which it has not been configured and/or optimized. This is true for many data entry devices, but chorded data entry devices in particular are affected because they receive data input from a user differently from non-chorded data entry devices.

Accordingly, it would be useful to have a chorded data entry device and/or system that can dynamically change the operation of the device to support multiple applications.

SUMMARY

In accordance with one example aspect described herein, a wearable data entry system includes one or more sensors configured to generate one or more signals representative of contact by one or more fingers against an arbitrary surface, and is configured to be worn on a user's hand. The system further includes at least one processor that detects which fingers contacted the arbitrary surface by analyzing the one or more signals during a data collection period and that generates data indicating which fingers contacted the arbitrary surface during the data collection period, and a transmitter that transmits to an external device, using a predetermined protocol, information corresponding to the fingers that contacted the arbitrary surface. The system also includes a memory that stores a mode value, wherein at least one of (i) the detecting by the at least one processor and (ii) the predetermined protocol used by the transmitter, depends on the stored mode value.

In accordance with another example aspect, a wearable data entry system includes one or more sensors configured to generate one or more signals representative of contact by one or more fingers against an arbitrary surface, and is configured to be worn on a user's hand. The system further includes at least one processor that extracts feature information from the one or more signals during a data collection period, and a transmitter that transmits the feature information to an external device using a predetermined protocol. The system also includes a memory that stores a mode value, wherein the data collection period depends on the stored mode value.

In yet another aspect, a wearable data entry system includes a plurality of sensors corresponding to respective fingers of a user's hand, which are worn on the user's hand and generate respective signals representative of contact by one or more fingers against an arbitrary surface. The system further includes a processor that detects which fingers contacted the arbitrary surface by analyzing the signals during a data collection period, generates data indicating which fingers contacted the arbitrary surface during the data collection period, and maps the generated data into other information, and a transmitter that transmits the other information resulting from the mapping to an external device, using a predetermined protocol. The system also includes a memory that stores a mode value, wherein at least one of (i) the detecting by the processor, (ii) the mapping by the processor, and (iii) the predetermined protocol used by the transmitter, depends on the stored mode value.

According to another aspect, a wearable data entry system includes a plurality of sensors corresponding to respective fingers of a user's hand, which are worn on the user's hand and generate respective signals representative of contact by one or more fingers against an arbitrary surface. The system also includes a processor that detects which fingers contacted the arbitrary surface by analyzing the signals during a data collection period, generates data indicating which fingers contacted the arbitrary surface during the data collection period, and maps the generated data into other information. The system further includes a transmitter that transmits the other information resulting from the mapping to an external device, using a predetermined protocol, and a receiver that receives a command from the external device to change the mode of operation, wherein, in response to the received command, the processor changes at least one of (i) the processing used to detect which fingers contacted the arbitrary surface, and (ii) the processing used to map the generated data into other information.

According to still another example aspect, a method of inputting data to an external device using a wearable data entry system includes generating one or more signals, representative of contact by one or more fingers against an arbitrary surface, using one or more sensors worn on a user's hand. The method further includes detecting which fingers contacted the arbitrary surface by analyzing the one or more signals during a data collection period and generating data indicating which fingers contacted the arbitrary surface during the data collection period, and transmitting to an external device, using a predetermined protocol, information corresponding to the fingers that contacted the arbitrary surface, wherein at least one of (i) the detecting and (ii) the transmitting depends on a stored mode value.

Further features and advantages, as well as the structure and operation, of various example embodiments of the present invention are described in detail below with reference to the accompanying drawings.

BRIEF DESCRIPTION OF THE DRAWINGS

The features and advantages of the example embodiments presented herein will become more apparent from the detailed description set forth below when taken in conjunction with the drawings.

DETAILED DESCRIPTION

The example embodiments of the invention presented herein are generally directed to chorded data entry devices and systems, and more particularly to a wearable chorded data entry device and system that can be placed into specific modes, each mode causing the system to be configured and/or optimized for the operation being performed.

Description of a Preferred Embodiment of a Data Entry Device

Figure 1:
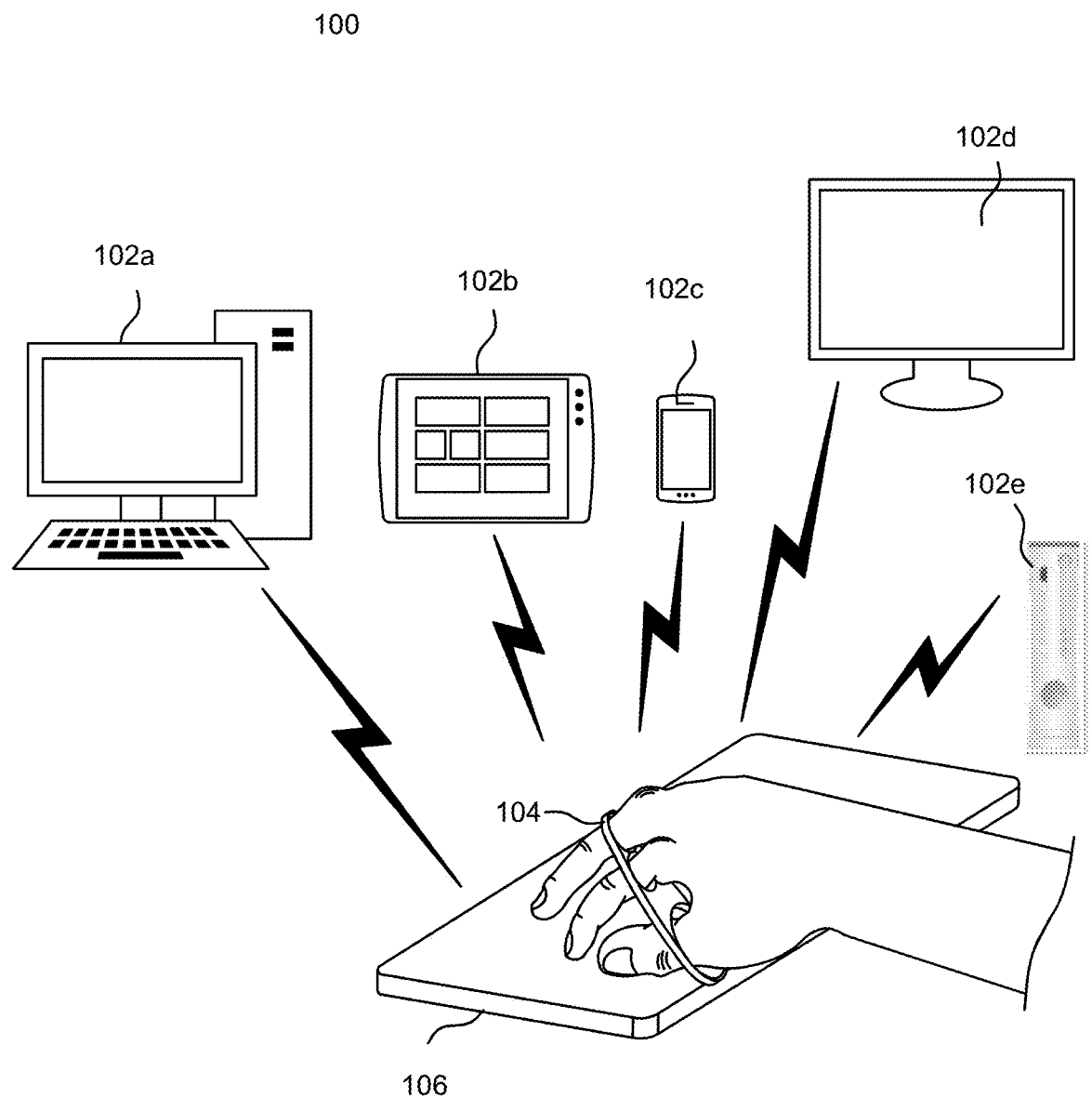
FIG. 1 illustrates an example system in accordance with various example aspects herein.

FIG. 1 illustrates an example system 100 that may be employed in accordance with various example aspects herein. As shown in FIG. 1, a chorded data entry device 104 (also referred to as a "tap device") enables an operator to tap a single finger or combination of fingers on an arbitrary surface 106, to provide input to a host device, such as a personal computer 102a, a tablet 102b, a mobile device 102c, a smart TV (sometimes referred to as a connected TV or hybrid TV) 102d, a gaming device 102e, and the like. Each such electronic device is referred to herein individually or collectively as a host device 102.

Chorded data entry device 104 allows the fingers of an operator to be arranged in any position, and neither the fingers nor their fingertips need to be aimed at any particular target. This allows for reduced finger travel and facilitates fast and accurate data entry. In addition, chorded data entry device 104 enables a user to input information to a host device by tapping a single finger or combination of fingers on any arbitrary surface, such as a table, a leg of the user, a chair, and/or the like. Since the surface can be arbitrary, the chorded data entry device 104 is highly mobile. Furthermore, the surface need not be planar. For example, the fingers could be curved around an object, such as a drinking glass or bottle.

Figure 2:
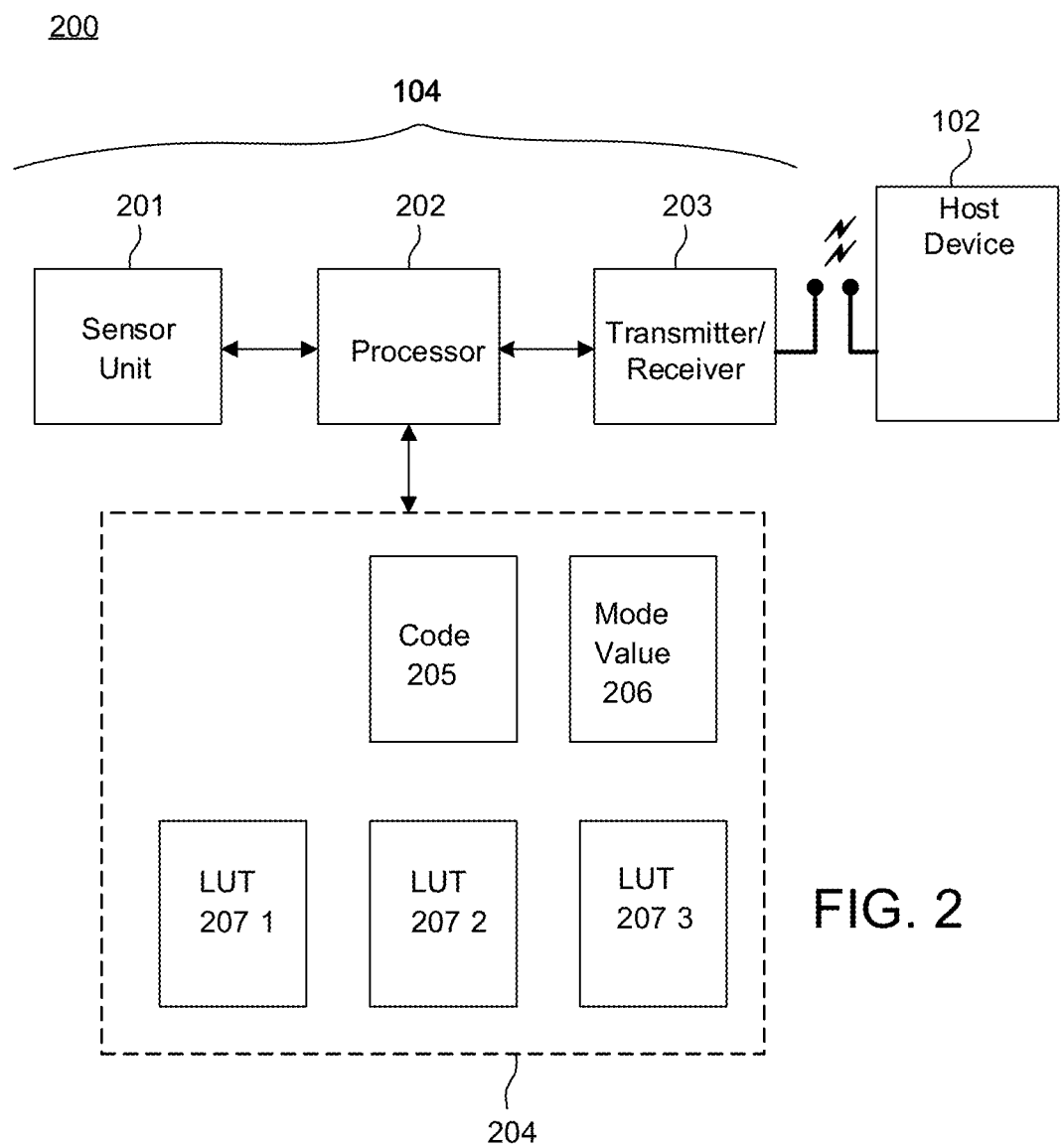
FIG. 2 is a system diagram that may be employed in accordance with various example aspects herein.
Figure 3:
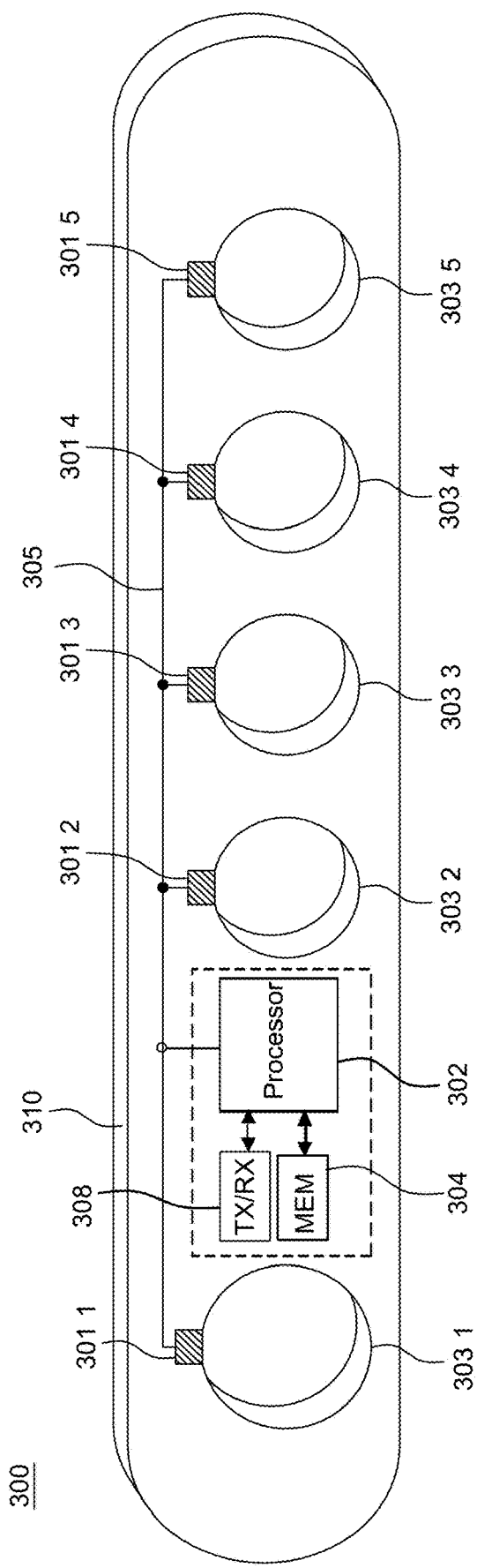
FIG. 3 illustrates an example chorded data entry device that may be employed in accordance with example embodiments herein.
Figure 4:
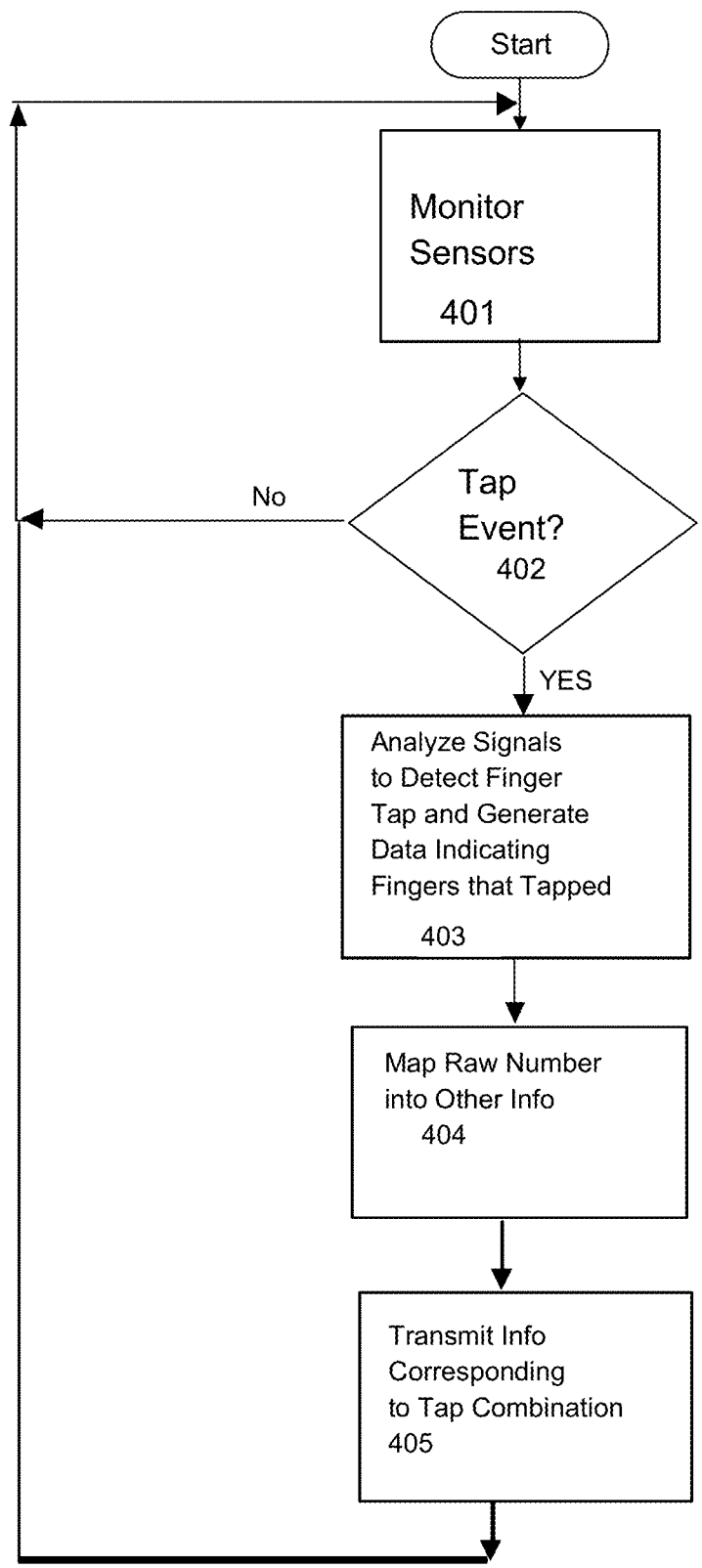
FIG. 4 is a flowchart showing a method of operation of one example embodiment of a chorded data entry device.
Figure 5:
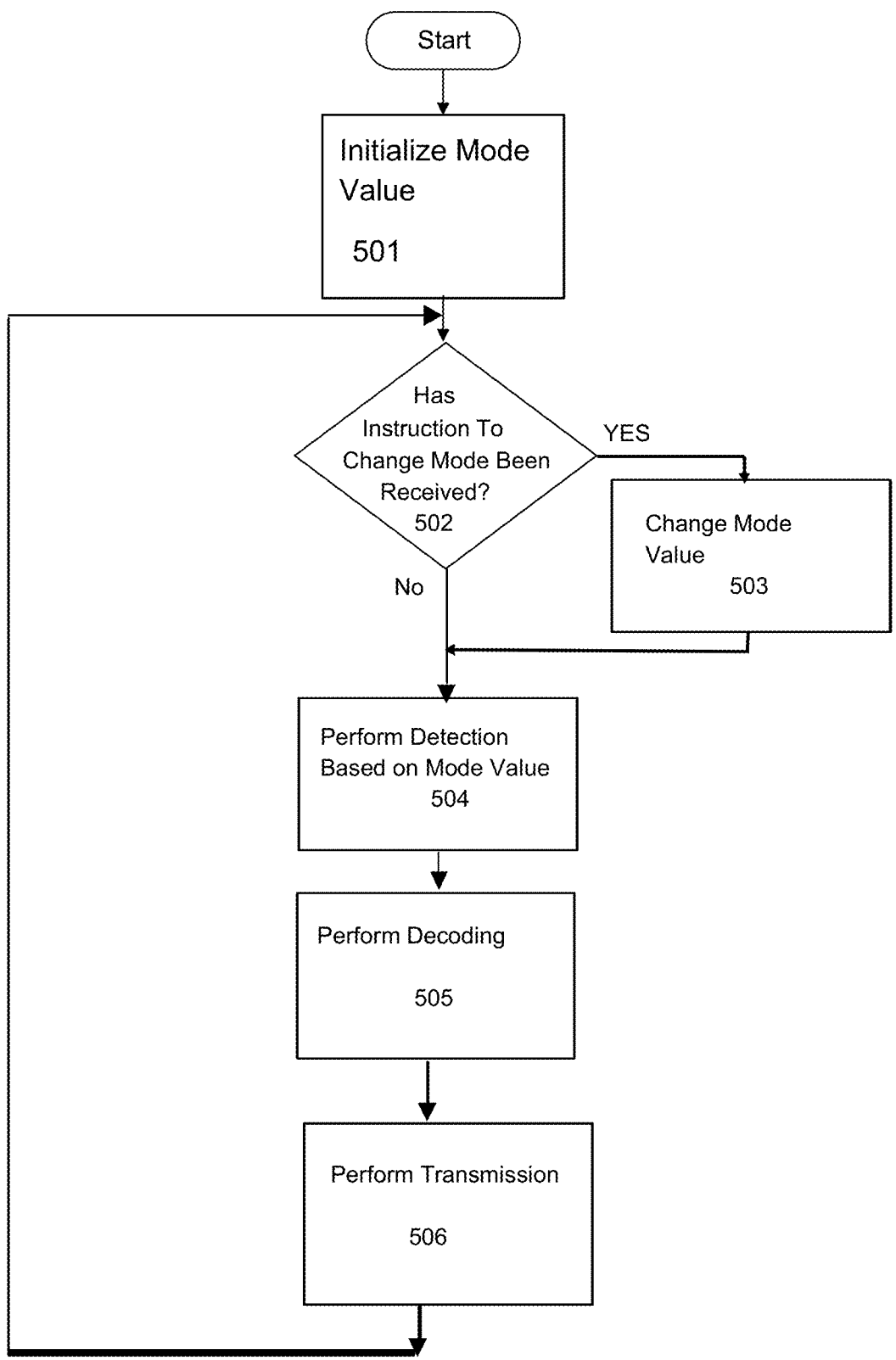
FIG. 5 is a flowchart showing one example of a method of changing the operation of a chorded data entry device in accordance with a change to a stored mode value.
Figure 6:
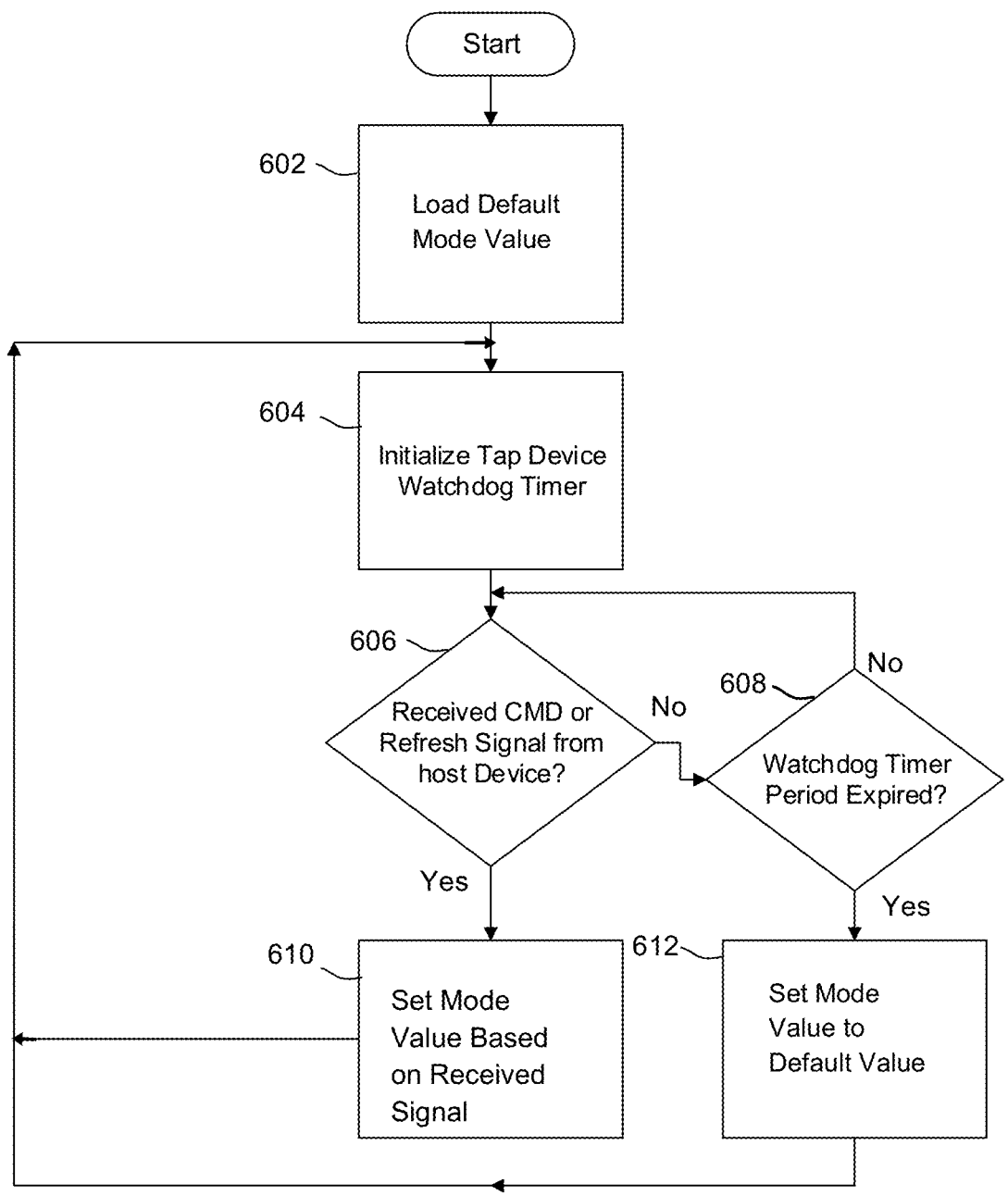
FIG. 6 is a flowchart illustrating an example procedure of preventing a data entry device from being stuck in an incorrect mode, which may be employed according to various example embodiments herein.

An overview of the structure of a preferred embodiment of the wearable data entry device will be provided with respect to FIG. 2 and FIG. 3, followed by an overview of the operation of a preferred embodiment with respect to FIG. 4 through FIG. 6.

FIG. 2 shows a block diagram for an example chorded data entry system 200 that may be employed in accordance with various example aspects. System 200 includes a chorded data entry device 104 having a sensor unit 201 that is coupled to a processor 202. Processor 202 is communicatively coupled to a transceiver (i.e., transmitter/receiver) 203. Transceiver 203 can be a combined radio transmitter unit and receiver unit that can transmit and receive communications between chorded data entry device 104 and a host device 102, or transceiver 203 can be separate transmitter and receiver units. In a preferred embodiment, communication between chorded data entry device 104 and host device 102 is via Bluetooth communication. As shown in FIG. 2, chorded data entry device 104 also includes a memory 204. Memory 204 may store code 205 to be executed by processor 202 as well as data used by chorded data entry device 104. In the preferred embodiment, the data stored in memory 204 includes a mode value 206 and one or more look up tables, e.g. 207-1, 207-2, 207-3.

Sensor unit 201 is preferably integrated into a wearable structure and constructed to capture finger taps against a surface. In a preferred embodiment, all components of the chorded data entry device are integrated into a wearable structure.

FIG. 3 illustrates an example chorded data entry device 300 in which all components are integrated into a wearable structure. In this preferred embodiment, sensor unit 201 includes a plurality of sensors each configured to generate a signal representative of contact by a respective finger with the arbitrary surface. As shown in FIG. 3, this preferred embodiment employs five mechanical sensors 301-1, 301-2, 301-3, 301-4, and 301-5 (collectively, 301), which in this preferred embodiment are accelerometers. In particular, in this preferred embodiment the sensors are accelerometers that can sense acceleration information in three directions that are perpendicular to each other (e.g., along an x axis, y axis, and z axis). The sensors 301 are integrated into a support structure 310 formed of a flexible material that can bend when worn. Support structure 310 has five holes 303-1 through 303-5, one each for the thumb and the four fingers of a user's hand, and sensors 301-1 through 301-5 are disposed adjacent to respective holes. Accordingly, when support structure 310 is worn on a user's hand, each sensor 301 is in contact with and/or adjacent to a respective finger of the hand.

Chorded data entry device 300 also has integrated therein a processor 302, transceiver 308, and memory 304. The sensors 301 and other components are electrically coupled via conductor 305 (which those skilled in the art will appreciate may take a variety of forms).

An example of how chorded data entry device 300 operates will be described with respect to FIG. 4. In block 401, the outputs of sensors 301 are monitored for any change in output. In particular, processor 302 receives the outputs and monitors for the beginning of a tap event, which is indicated by a change in output from any of the sensors 301 above a pre-determined threshold.

In block 402, processor 302 determines whether a tap event has occurred. If not, then monitoring continues in block 401. Once a tap event is sensed, flow proceeds to block 403 and processor 302 analyzes data corresponding to each of the sensors 301 for a predetermined period of time, i.e., the collection period. The collection period can preferably be varied, for example, by changing the value of a parameter used by code executed by the processor. Different applications of the data entry device will require different collection periods for optimal performance. A preferred range of collection periods is, for example, from about 10 ms to about 100 ms.

Also, although in this preferred embodiment processor 302 analyzes signals from all five of the sensors 301, processor 302 can be programmed to ignore signals from some of the sensors. Hence, the data entry device can be used for applications where fewer than five fingers are used to input data.

Processor 302 analyzes the received sensor signals to determine which of the fingers associated with the respective sensors 301 has made contact with a surface. When a particular finger taps the surface, there may be incidental movement of other fingers even though they do not tap the surface. Hence, in this preferred embodiment, processor 302 analyzes the signals from multiple sensors (i.e., the waveforms associated with the movement of multiple fingers) and determines which finger or fingers actually tapped the surface based on features from the waveforms, such as peak amplitude, pulse width, rise time, time of arrival or (in the frequency domain) the power density.

In addition, it is important to distinguish the case where multiple fingers tap the surface at the same time from the case where different fingers (or combinations of fingers) tap the surface in rapid succession. Processor 302 determines that a combination of fingers tapped the surface at the same time by use of the collection period. That is, if more than one finger is determined to have tapped the surface during the same collection period, then it is determined that the user intended to tap the combination of fingers.

Since it is only necessary to detect which fingers are in contact with the surface at the time of the tap, the particular surface and the particular position of the fingers are not important. Moreover, the user need not aim the fingertips at a specific key or location, or start the tap from a specific point (unlike in a gesture based system), thus making the data entry process fast and reliable.

Processor 302 generates data indicative of which finger or combination of fingers are determined to have tapped the surface. In this preferred embodiment, using five fingers, there are thirty-one possible outcomes for tapping by a single finger or a combination of fingers. Processor 302 therefore generates a "raw" number, e.g., with a value from 1 to 31, indicative of the finger or combination of fingers that contacted the surface.

In this preferred embodiment, processor 302 then maps the raw number to another value in block 404. For example, in a natural language application, the raw number is mapped to a character or command. In this preferred embodiment, this mapping is done using a look-up table stored in memory 304. The raw number is used to index into the table and the value stored in the table at the location corresponding to the index value is output. In other words, the raw number is "decoded" to obtain other information corresponding to the finger or combination of fingers that tapped the surface.

Next, in block 405, transceiver 308 transmits the other information resulting from mapping or decoding the raw number to host device 102 (e.g., host device 102a, 102b, 102c, 102d, or 102e of FIG. 1). In this preferred embodiment, the transmission is performed using Bluetooth communication.

Flow then returns to block 401 to monitor the sensor signals for further tap events.

Table 1 shows one example of how finger tap combinations can be mapped to printable ASCII characters and common control characters. In particular, Table 1 shows which default keyboard character and which alternate keyboard character corresponds to each finger combination. Finger combinations are identified in the chart by a string of five characters corresponding to the five fingers, respectively, of a user's hand. For instance, the left-most one of the five characters may correspond to a user's thumb on their right hand or the user's pinky on their left hand, and so on. The right-most one of the five characters may correspond to a user's pinky on their right hand or their thumb on their left hand, and so on. In each finger combination an X represents a finger that is involved in a tap, and an O represents a finger that is not involved in the tap, thereby representing the various combinations as a binary number. Table 1 also shows the "raw" number corresponding to each combination in this preferred embodiment.

TABLE 1

CHARACTER MAP EXAMPLE

| "Raw" number | FINGER COMBO. | DEFAULT KEYBOARD | | ALTERNATE KEYBOARD | |
| --- | --- | --- | --- | --- | --- |
| | | No Shift | Shift | No Shift | Shift |
| 1 | XOOOO | A | A | 1 | |
| 2 | OXOOO | E | E | 2 | |
| 3 | XXOOO | N | N | 6 | |
| 4 | OOXOO | I | L | 3 | |
| 5 | XOXOO | S | S | ? | |
| 6 | OXXOO | T | T | 7 | |
| 7 | XXXOO | SHIFT | SHIFT | SHIFT | |
| 8 | OOOXO | O | O | 4 | |
| 9 | XOOXO | K | K | , | |
| 10 | OXOXO | M | M | ( | ) |
| 11 | XXOXO | J | J | - | |
| 12 | OOXXO | L | L | 8 | |
| 13 | XOXXO | X | X | / | \ |
| 14 | OXXXO | DELETE | DELETE | DELETE | |
| 15 | XXXXO | R | R | . | |
| 16 | OOOOX | U | U | 5 | |
| 17 | XOOOX | Y | Y | ' | " |
| 18 | OXOOX | G | G | : | |
| 19 | XXOOX | B | B | ! | |
| 20 | OOXOX | F | F | < | > |
| 21 | XOXOX | W | W | # | * |
| 22 | OXXOX | Q | Q | + | = |
| 23 | XXXOX | Z | Z | ∧ | ~ |
| 24 | OOOXX | d | D | 9 | |
| 25 | XOOXX | C | C | $ | % |
| 26 | OXOXX | P | P | @ | & |
| 27 | XXOXX | V | V | [ | ] |
| 28 | OOXXX | TOGGLE | TOGGLE | TOGGLE | |
| 29 | XOXXX | RETURN | RETURN | RETURN | |
| 30 | OXXXX | H | H | 0 | |
| 31 | XXXXX | SPACE | SPACE | SPACE | |

For the case of a natural language application using Table 1, the Bluetooth human interface device (HID) keyboard profile is used as the transmission protocol to transmit a character or command to the host device.

As an example of this preferred embodiment using Table 1, to input the letter "a," the user momentarily taps their thumb on a surface, in which case processor 302 determines that the thumb was in contact with the surface at the moment of the tap, generates a raw value of 1, maps the 1 to the letter "a" and transmits the letter "a" to the host device. To input a capital "A," the user would first tap with their thumb, first, and middle fingers simultaneously on a surface. This would be interpreted as the "SHIFT" command and a "SHIFT" command would be transmitted to the host device. Then, the user would tap the "A" as before, with their thumb.

As described above, in this preferred embodiment, in a natural language application using the English language, chorded data entry can be performed with one hand by tapping a finger or combination of fingers on an arbitrary surface, and every possible combination of finger taps (a total of thirty-one) can be used to input a character or command.

Mode Shifting

A preferred embodiment in which the stored mode value 206 is used to determine the manner of operation of the chorded data entry system, and in which the mode can be dynamically switched, will be described with respect to FIG. 5 and FIG. 6.

As shown in FIG. 5, in block 501 the mode value is initialized. In this preferred embodiment, the mode value is initialized to a default value that is stored in non-transitory memory and read out when the device is powered on. In particular, in this embodiment the default mode value is 0, which corresponds to a natural language mode using the English language. Next, in block 502 it is determined whether an instruction to change the mode has been received. If not, flow proceeds to block 504. If it is determined in block 502 that an instruction to change the mode has been received, then flow proceeds to block 503 in which the mode value is changed in accordance with the received instruction, and then flow proceeds to block 504.

Next, in block 504 detection is performed to determine a finger or combination of fingers that have tapped an arbitrary surface in accordance with the mode value. For example, this can be implemented in program code using a series of if-then statements, such as "If mode=0 then execute detection subroutine DS0, else if mode=1 then execute detection subroutine DS1, else if mode=2 then execute detection subroutine DS2."

Next, in block 505 decoding of the detected finger combination to generate other information (e.g., a character or command correspond to the "raw" value indicating the detected finger combination) is performed in accordance with the mode value. For example, this can be implemented using if-then statements as described above, such as "If mode=0 then execute decoding using LUT 207-1, else if mode=1 the execute decoding using LUT 207-2, else if mode=3 then execute decoding using LUT 207-3."

Next, in block 506 transmission is performed in accordance with the mode value. Again, this can be implemented using a series of if-then statements, such as "If mode=0 then use transmission protocol 1, else if mode=1 then use transmission protocol 2, else if mode=2 then use transmission protocol 3."

Flow then returns to block 502.

Thus, in this preferred embodiment the mode value is used to determine various aspects of detecting the combination of fingers that tapped the arbitrary surface (e.g., which sensor signals/fingers to monitor and analyze, length of the collection period), decoding the detected combination (e.g., which LUT 207 to use), and transmitting information corresponding to the detected combination of fingers to the host device (e.g., which transmission protocol to use, such as a predetermined Bluetooth profile). Those skilled in the art will appreciate that, depending on the application for which the chorded data entry device is used, some aspects of the operation need not be dependent on the mode value. Also, those skilled in the art will appreciate that there are various ways of utilizing the mode value to change the manner of operation. For example, the mode value can be used to set a value set for a particular parameter (e.g., a parameter defining the length of the data collection period), to determine which lines of code to execute to perform a particular aspect of operation (e.g., execute a certain subroutine to perform detection in a first mode and a different subroutine to perform detection in a second mode), or to determine an entire set of code to perform depending on the mode (e.g., execute certain code to perform detection, decoding, and transmission for a first mode, and execute different code to perform detection, decoding, and transmission for a second mode).

In accordance with preferred embodiments described herein, the operation of the chorded data entry system can be dynamically switched to a different mode by changing the mode value. The various functions performed by the chorded data entry system that may depend on the mode value, such as the processes performed for detecting a finger tap combination, decoding the finger tap combination, and/or transmitting information corresponding to the finger tap combination to a host device, will alter operate in accordance with the changed mode value. Hence, the chorded data entry device can be reconfigured for different applications dynamically. For example, the device can be used to enter language characters for a word processing application, and then switched to a mode for inputting commands for a gaming application, inputting commands for a music application, or some other application running on the host that uses input commands other than natural language characters.

The mode can be dynamically switched by changing the mode value in a variety of ways. In this preferred embodiment, the mode value is changed in response to an instruction received from an application executing on host device 102, which is sent from host device 102 to the chorded data entry device 104 using a custom Bluetooth profile.

In order to ensure that chorded data entry device 104 does not get stuck in an incorrect mode due to, for example, a software or hardware malfunction in host device 102, chorded data entry device 104 according to this preferred embodiment also includes a watchdog timer. After the watchdog timer has been reset (or initialized for the first time), it automatically generates a trigger within a predetermined period if a mode change command is not received within the predetermined period (e.g., two seconds). The trigger causes processor 202 to change the mode value back to the default value.

FIG. 6 is a flowchart illustrating an example procedure for the watchdog timer that may be employed according to various example embodiments herein. At block 602, the mode value stored in chorded data entry device 104 is initialized, which in this preferred embodiment involves loading a default value that is prestored in non-transitory memory of chorded data entry device 104.

In block 604 the watchdog timer is initialized. As noted above, after a predetermined period of time, the watchdog timer generates a trigger. A determination is made at block 606 as to whether a command or refresh signal from the host device 102 has been received. If not, then a determination is made in block 608 whether the watchdog timer period has expired (e.g., a predetermined period has expired). If the watchdog timer period has expired, then the chorded data entry device 104 mode value is to the device's default mode value in block 612 and the watchdog timer is reset at block 604, and the procedure continues as described above.

If the period of the watchdog timer has not yet expired in block 608 then the routine loops back to block 606 to wait for a command or other refresh signal from the host device 102.

If block 606 determines that the chorded data entry device 104 has received a change command or refresh signal form the host device, then the chorded data entry device 104 continues to use the current profile, or changes the mode value to the new value if a change command was received, and the watchdog timer is reset as shown in blocks 610 and 604. The procedure then continues as described above.

Example Modes

A number of exemplary modes will be described to illustrate how dynamic switching of the mode enables chorded data entry device 104 to be optimized and/or customized for different applications. These examples should not be deemed to limit the invention.

Table 2 identifies several example modes and the corresponding mode value in a preferred embodiment.

TABLE 2

| Value | Mode |
|---|---|
| 0 | Natural Language - English (default) |
| 1 | Natural Language - Spanish |
| 2 | Raw |
| 3 | Gamepad |
| 4 | MIDI (music) |
| 5 | Braille - Two Hand |
| 6 | Braille - One Hand |
| 7 | Voiceover Mode |
| 8 | Debug |
| 9 | Pinyin |

Natural Language—English

When an input device is intended to be used for the entry of alphanumeric information in the English language, the detecting and decoding functions can be optimized for a language processing system. First, in a preferred embodiment, the processing executed in association with a mode value of 0 is configured to monitor a signal or signals corresponding to all five fingers on one hand. (In other applications, only a subset of fingers, such as three fingers, may be monitored and the signals corresponding to the other fingers ignored.)

Next, the collection period used for a mode value of 0 is set to a relatively long period, such as 60 ms. Specifically, while language processing systems optimally require a high degree of accuracy, they can tolerate a reasonable amount of latency. Therefore, in this mode, a relatively long time window (e.g., 60 ms) can be employed to collect finger-tap information. This is an acceptable amount of latency for an alphanumeric system because input speeds are typically much slower than such a time window, and because it is visually indistinguishable to a user for the characters to appear on screen with a short delay (e.g., <100 ms). This mode allows an alphanumeric input system to be accurate as possible for a wide variety of users by providing a relatively long data collection window. This further allows a user to have sufficient time to register the position of each finger.

In addition, the decoding function for a mode value of 0 is configured to use a particular LUT 207 (e.g., LUT 207-1) that maps the raw value of 1 to 31 indicating a particular finger tap combination to a specific character or command. In one example implementation, the mapping is performed to relate the most common letters of the language (English in this case) to the easiest finger combinations and the least common letters to the most difficult combinations.

Furthermore, for an application involving input of data relating to natural language, language-based algorithms may be utilized to provide for greater accuracy of the system. For example, such a system may utilize a dictionary to arbitrate between ambiguous finger input data. Thus, the processing to be executed to perform decoding for a mode value of 0, in addition to performing mapping using a particular LUT, would also perform additional processing to resolve such ambiguities.

Regarding transmission of information to the host device 102, the Bluetooth HID keyboard profile is used to transmit information corresponding to the detected finger combination.

In this mode, the processing is also configured to detect and decode multi-taps, as described in U.S. Patent Application No. 62/490,873, filed on Apr. 27, 2017, which is herein incorporated by reference.

Hence, the processing for mode value=0 is optimized for natural language input (for example, by using an appropriate collection period) and customized by using an appropriate LUT to map finger combinations to specific characters or commands for the English language.

Natural Language—Spanish

Processing for mode value=1, i.e., natural language mode for Spanish, is the same as that for mode value=0 except that processing decoding is different. For example, a different LUT 207 (e.g., LUT 207-2) is used that maps the input finger combinations to appropriate characters or commands in the Spanish language, and the additional processing for resolving ambiguities is also different (for example, by referring to a Spanish language dictionary instead of an English language dictionary).

Raw

The processing for the raw mode (mode value=2) is similar to that for a natural language mode, but there are a few differences. The data collection period for raw mode is preferably the same or comparable to that for modes 0 and 1. In this mode, no mapping (i.e., decoding) is performed of the data generated by detecting the finger combination. Instead, the raw value from 1 to 31 is transmitted to the host device. Also, multi-taps are not decoded in this mode.

The raw information can be transmitted using a Bluetooth HID profile or, alternatively, using a custom Bluetooth communication profile like that described above for receiving a change mode command from the host device.

Gamepad

In the gamepad mode, since the purpose is to control real-time events in a game, the relatively long latency tolerable with natural language (i.e., alphanumeric) entry systems would not always be acceptable. With real-time event applications, the speed of response is more important than the ability of the system to accommodate users with slow fingers. As such, a shorter time window would be more optimal. Accordingly, for mode value=3, a collection period that is relatively short, such as 10 ms, is used.

As in the raw mode, in this preferred embodiment no mapping is performed but instead the raw value indicating the finger tap combination is sent to the host device. The transmission is preferably performed using the Bluetooth HID gamepad profile.

MIDI (Music)

The music mode (mode value=4) is similar to the gamepad mode. As with the gamepad mode, the collection period is set to be relatively short to enable real time input with low latency. Transmission of information to the host device is performed using the Bluetooth MIDI profile.

Braille—Two Hand

Two-hand Braille mode (mode value=5) is meant to emulate a Braille keyboard that uses six key entry. Accordingly, two hands are needed in order to permit six key entry, and a chorded data entry device must be worn on both hands. The device worn on one hand is designated as the master device that performs processing of the input data. The processing performed in this mode is configured to monitor signals corresponding to fingers on the hand wearing the master device and also to receive input (for example, via wireless communication such as Bluetooth) from the chorded data entry device worn on the other hand. The processing is therefore configured to use signals corresponding to six fingers when detecting the combination of fingers that have tapped. The collection period is relatively long, as with modes 0 and 1. Decoding is performed using a LUT 207 designed to map six key combinations into Braille characters.

The flexibility of the system can be seen in that either a standard LUT 207 can be used, or a LUT 207 that has been customized for a particular user can be used. Furthermore, such a two-handed approach can be used for other applications that require more than 5 points of contact, such as stenography.

Braille—One Hand

As an alternative to using two hands to input in Braille, multiple taps can be utilized to input the complete set of Braille letters and numbers by mapping the combinations of five fingers on a single hand to a character or command. Thus, just as Table 1 above illustrates how more than 31 English characters or commands can be input using just five fingers, in this mode mapping of the finger combinations is performed to enable all Braille characters and commands to be input.

Voiceover Mode

VoiceOver mode (mode value=7) enables the input of voiceover key-combinations, i.e., hotkeys. (VoiceOver is a screen reading technology that operates on certain iOS and OSX operating systems.) In this mode, the processing is configured to analyze the signals and both the tap combination as well as the directional movement of the hand. The decoding maps tap data to VoiceOver key combinations, which are transmitted to the host device. The transmission is preferably performed using a Bluetooth HID profile.

Debug

The debug mode (mode value=8) is like the raw mode, but in this mode all of the feature information which has been extracted from the waveforms is sent to the host device using the custom Bluetooth communication mentioned above, in addition to sending information corresponding to alphanumeric characters using the Bluetooth HID keyboard profile.

Pinyin Mode

Pinyin is a system of inputting Chinese characters. In this mode (mode value=9), characters are built by utilizing a sequence of menus to add to the initial input. The collection period is set relatively long, as with natural language input modes 0 and 1. The initially detected finger tap combination is mapped to a first character, and then a menu is designated so that a following detected finger tap combination is mapped to a designated add-on to the initial character. The composite information is preferably transmitted using a Bluetooth HID profile, but alternatively the resulting of decoding each sequential tap can be transmitted to the host device using, for example, a custom Bluetooth communication technique, and the final character can be constructed at the host device.

This mode demonstrates how the chorded data entry device 104 can be used to input information in other situations in which characters or commands are built by consecutive sequences of operations or in which sequential menus are to be accessed by consecutive operations, i.e., particular finger tap combinations can be mapped into a selection from a first menu, then a following detected finger tap combination can be mapped into a selection from a submenu, etc.

Alternative Embodiments

Those skilled in the art will appreciate that many variations on the structure and/or operation of the disclosed chorded data entry device are possible, some of which are described below.

In a preferred embodiment described above, sensor unit 201 is embodied as a plurality of sensors 301 that each comprise an accelerometer. In place of accelerometers, other types of sensors can be used such as, for example, vibration sensors, tactile sensors, force sensors, pressure sensors, gyroscopes, and the like, to sense the mechanical quantities other than acceleration associated with corresponding fingers, such as vibration, force, pressure and the like. When, for example, a sudden change in mechanical quantity such as vibration, force, pressure or the like is sensed by any one or more of the sensors 301 of an alternative type, processor 302 reads the output of the respective sensor(s) 301 and processes the information.

Figure 7:
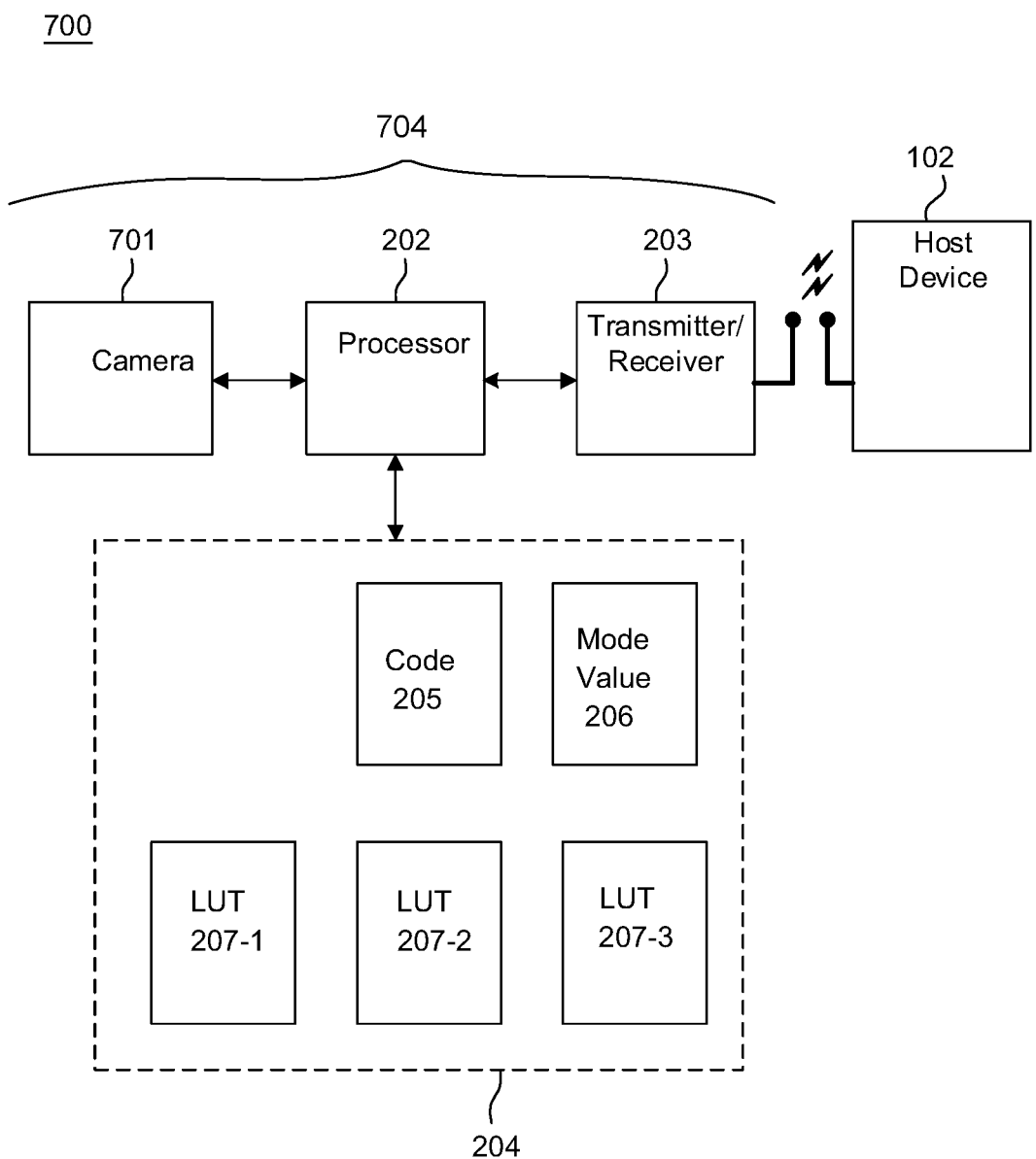
FIG. 7 is a system diagram that may be employed in accordance with various example aspects herein, in which a camera is used as the sensor unit.

Other alternative example embodiments of sensor unit 201 can be, for example, as described in U.S. Patent Publication No. 2016/0259407. For example, a sensor unit that operates as a camera can be used to detect and convey information that constitutes images of fingers of a hand and a surface that the fingertips or substantially the fingertips of the fingers contact. The sensor unit can be arranged to have the fingers in its field of view. Accordingly, the sensor unit may be considered a special purpose camera or a camera that has been purposed and arranged for the particular applications described herein. Hence, the signal output by the sensor unit is an image, which is analyzed by a processor to detect which fingers have contacted (i.e., tapped) the arbitrary surface. FIG. 7 shows a block diagram for an example chorded data entry system 700 that is similar to system 200 shown in FIG. 2 except that it depicts a camera 700 as the sensor unit in a chorded data entry device 704.

Such a sensor unit may be integrated into a wearable structure such that the camera is located at the bottom of a wrist or palm of a user (also commonly referred to as the dorsal surface of a hand or palmar surface of a hand, respectively). In this embodiment, the camera is arranged in a manner that allows all of the fingertips of the user to be within its field of view. The other components of the system including the processor 202 and transceiver 203 can be located elsewhere or inside the housing or on the housing or the structure supporting the sensor unit 201.

In a preferred embodiment discussed above, in certain modes processor 302 decodes the raw value (e.g., value from 1 to 31) indicative of a finger or combination of fingers that contacted the arbitrary surface during a data collection period and sends that decoded information (for example, the output from a LUT) to the host device, and in other modes (for example, the raw mode and the gamepad mode) processor 302 sends the raw value to the host device without performing any decoding (if necessary, decoding can be performed in the host device). According to one alternative embodiment, data from the sensors can be sent directly to a host device without analyzing the sensor data to determine which finger combination has been tapped. That analysis may be performed in the host device 102.

As another alternative embodiment, processor 302 performs some processing on the sensor data to extract certain features from the sensor data, such as peak amplitude, pulse width, rise time, time of arrival or (in the frequency domain) the power density for each of the received sensors signals. Such feature information may be transmitted to the host device and further analysis of those features could then be performed in the host device to determine the finger tap combination.

An analog to digital converter can be included between the sensor unit and the processor, if necessary, depending on the type of signals output by the sensors in the sensor unit and the type of interface available to input information to the processor.

Memory 204 can be any appropriate memory type or combination of memory type suitable for the functions to be performed, but preferably includes a combination of non-volatile memory (which stores, for example, code for execution by the processor, a default mode value, parameters needed for operating in different modes, and information to resolve ambiguities in entering natural language data) and volatile memory.

The components described herein can be implemented individually as hardware, software or a combination of both hardware and software. For example, as routines (i.e., code instructions) stored in a non-transitory memory or as circuits implemented in hardware. In this regard, processor 202 can be implemented as a microprocessor, as an ASIC or other specific circuit, or as a microcontroller that integrates memory, i/o functions, and other portions of a system needed to perform the described functions.

As mentioned above, depending on the application for which the chorded data entry device is being used, the processor can be configured to ignore sensor signals associated with some finger and use sensor signals from only a subset of fingers (for example, three fingers). On the other hand, as mentioned above, the processor can be configured to receive sensor data, or information derived therefrom, from a chorded data entry device on another hand (for example, the data may be received via Bluetooth communication) and process sensor data from two hands.

While the preferred technique for communication between data entry device 104 and host device 102 is via Bluetooth communication, other wireless communication techniques can be used, such as Wi-Fi communication. A cable connection may also be suitable for some applications.

In the preferred embodiment described above, a command to change the mode value is sent from an application executing on the host device 202. However, the mode value could be set manually from the chorded data entry device 104 itself, for example, by entering a particular tap sequence. Upon detecting a predetermined sequence of taps, tap device 104 enters a corresponding mode. In a variant of this embodiment, a manual switch (e.g., a dip switch) can be used to set the mode value.

Those skilled in the art will further appreciate that there are other ways of switching the mode besides storing an explicit mode value. For example, a processor can interpret a received command to change modes and, based on that command, branch to execute different code (e.g., a different subroutine) that causes the processor to operate in a manner appropriate for the new mode. Hence, the processor does not reference a stored mode value but rather the "mode value" is contained in a command to change mode and the processor executes different code as a result of receiving the change command.

Software embodiments of the example embodiments presented herein may be provided as a computer program product, or software, that may include an article of manufacture on a machine accessible or machine readable medium having instructions. The instructions on the non-transitory machine accessible machine readable or computer-readable medium may be used to program a computer system or other host device. The machine or computer-readable medium may include any type of media/machine-readable medium suitable for storing or transmitting electronic instructions. The techniques described herein are not limited to any particular software configuration. They may find applicability in any computing or processing environment. The terms "computer-readable", "machine accessible medium" or "machine readable medium" used herein shall include any medium that is capable of storing, encoding, or transmitting a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

Portions of the example embodiments of the invention (e.g., host devices 102) may be conveniently implemented by using a conventional general purpose computer, a specialized digital computer and/or a microprocessor programmed according to the teachings of the present disclosure, as is apparent to those skilled in the computer art. Appropriate software coding may readily be prepared by skilled programmers based on the teachings of the present disclosure.

Some embodiments may also be implemented by the preparation of application-specific integrated circuits, field programmable gate arrays, or by interconnecting an appropriate network of conventional component circuits.

Some embodiments include a computer program product. The computer program product may be a storage medium or media having instructions stored thereon or therein which can be used to control, or cause, a computer to perform any of the procedures of the example embodiments of the invention. The storage medium may include without limitation an optical disc, a Blu-ray Disc, a DVD, a CD or CD-ROM, a micro-drive, a magneto-optical disk, a ROM, a RAM, an EPROM, an EEPROM, a DRAM, a VRAM, a flash memory, a flash card, a magnetic card, an optical card, nanosystems, a molecular memory integrated circuit, a RAID, remote data storage/archive/warehousing, and/or any other type of device suitable for storing instructions and/or data.

Stored on any one of the computer readable medium or media, some implementations include software for controlling both the hardware of the general and/or special computer or microprocessor, and for enabling the computer or microprocessor to interact with a human user or other mechanism utilizing the results of the example embodiments of the invention. Such software may include without limitation device drivers, operating systems, and user applications. Ultimately, such computer readable media further includes software for performing example aspects of the invention, as described above.

Included in the programming and/or software of the general and/or special purpose computer or microprocessor are software modules for implementing the procedures described above.

The modes, mechanisms for changing from one mode to another, and the configurations and/or optimizations described herein are not intended to limit the application to the example embodiments presented herein. In fact, after reading the foregoing description it will be apparent to one skilled in the relevant art(s) how to implement the invention in chorded entry systems used for applications requiring alternative modes, optimizations or alternative means for changing from one mode to another.

While various example embodiments have been described above, it should be understood that they have been presented by way of example, and not limitation. It is apparent to persons skilled in the relevant art(s) that various changes in form and detail can be made therein. Thus, the invention should not be limited by any of the above described example embodiments. Also, as used herein, the singular forms "a," "an," and "the," are intended to include the plural forms as well, unless the context clearly indicates otherwise.

In addition, it should be understood that the figures are presented for example purposes only. The architecture of the example embodiments presented herein is sufficiently flexible and configurable, such that it may be utilized and navigated in ways other than that shown in the accompanying figures.

Further, the purpose of the Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the example embodiments presented herein in any way. It is also to be understood that the procedures described herein need not be performed in the order presented.

I claim:

1. A wearable data entry system capable of operating in a plurality of modes, comprising:
   a plurality of sensors corresponding to respective fingers of a user's hand, which are worn on the user's hand and generate respective signals representative of contact by one or more fingers against an arbitrary surface;
   at least one processor that detects which fingers contacted the arbitrary surface by analyzing the signals generated during a data collection period, generates data indicating which fingers contacted the arbitrary surface during the data collection period, and maps the generated data into other information;
   a transmitter that transmits the other information resulting from the mapping to an external device, using a predetermined transmission protocol; and
   a memory that stores a mode value corresponding to one of the plurality of modes,
   wherein each of the plurality of modes has an associated set of one or more detection parameters used for detecting which fingers contacted the arbitrary surface, an associated predetermined transmission protocol, and an associated mapping between the generated data indicating which fingers contacted the arbitrary surface and the other information, and
   wherein, in accordance with a change in the stored mode value, the operating mode of the data entry system changes due to a change in at least one of (i) the set of one or more detection parameters used by the at least one processor for detecting which fingers contacted the arbitrary surface, (ii) the mapping between the generated data indicating which fingers contacted the arbitrary surface and the other information used by the at least one processor, and (iii) the predetermined transmission protocol used by the transmitter.

2. The wearable data entry system according to claim 1, wherein the at least one processor is configured to change the mode value stored in the memory in accordance with at least one of (i) a mode command received from the external device, (ii) manual adjustment of at least one switch on the wearable data entry system, and (iii) detection of a particular combination of fingers contacting the arbitrary surface.

3. The wearable data entry system according to claim 1, wherein the set of one or more detection parameters includes a length of the data collection period used in the detecting, and the length of the data collection period changes in accordance with a change in the stored mode value.

4. The wearable data entry system according to claim 1, wherein the set of one or more detection parameters includes a number of fingers for which corresponding signals are analyzed, and the number of fingers for which corresponding signals are analyzed changes in accordance with a change in the stored mode value.

5. The wearable data entry system according to claim 1, wherein the memory stores a plurality of look up tables, and wherein the mapping between the generated data and the other information that is associated with each operating mode corresponds to a respective look up table.

6. A method of inputting data to an external device using a wearable data entry system capable of operating in a plurality of modes and having a mode value stored in a memory, comprising:
   generating one or more signals, representative of contact by one or more fingers against an arbitrary surface, using one or more sensors worn on a user's hand;
   detecting which fingers contacted the arbitrary surface by analyzing the one or more signals generated during a data collection period and generating data indicating which fingers contacted the arbitrary surface during the data collection period; and
   transmitting to an external device, using a predetermined transmission protocol, information corresponding to the fingers that contacted the arbitrary surface,
   wherein each of the plurality of modes has an associated set of one or more detection parameters used for detecting which fingers contacted the arbitrary surface and an associated predetermined transmission protocol, and
   wherein, in accordance with a change in the stored mode value, the operating mode of the data entry system changes due to a change in at least one of (i) the set of one or more detection parameters used in the detecting of which fingers contacted the arbitrary surface and (ii) the predetermined transmission protocol used in the transmitting.

7. The method according to claim 6, further comprising:
   mapping the data indicating which fingers contacted the arbitrary surface to other information, wherein the mapping is performed using one of a plurality of stored look up tables in accordance with the stored mode value, and wherein the information transmitted to the external device is the other information resulting from the mapping.

8. The method according to claim 6, wherein the method further comprises changing the stored mode value in accordance with one of (i) a mode command received from the external device, (ii) manual adjustment of at least one switch on the wearable data entry system, and (iii) detection of a particular combination of fingers contacting the arbitrary surface.

9. The method according to claim 6, wherein the set of one or more detection parameters includes a length of the data collection period used in the detecting, and the length of the data collection period changes in accordance with a change in the stored mode value.

10. A wearable data entry system capable of operating in a plurality of modes, comprising:
one or more sensors configured to generate one or more signals representative of contact by one or more fingers against an arbitrary surface, and configured to be worn on a user's hand;
at least one processor that detects which fingers contacted the arbitrary surface by analyzing the one or more signals generated during a data collection period and that generates data indicating which fingers contacted the arbitrary surface during the data collection period;
a transmitter that transmits to an external device, using a predetermined transmission protocol, information corresponding to the fingers that contacted the arbitrary surface; and
a memory that stores a mode value corresponding to one of the plurality of modes,
wherein each of the plurality of modes has an associated set of one or more detection parameters used for detecting which fingers contacted the arbitrary surface and an associated predetermined transmission protocol, and
wherein, in accordance with a change in the stored mode value, the operating mode of the data entry system changes due to a change in at least one of (i) the set of one or more detection parameters used by the at least one processor for detecting which fingers contacted the arbitrary surface and (ii) the predetermined transmission protocol used by the transmitter.

11. The wearable data entry system according to claim 10, wherein the one or more sensors comprise a camera, the one or more signals comprise an image in which the one or more fingers contacting the arbitrary surface are in the field of view, and the at least one processor determines which fingers contacted the arbitrary surface by analyzing the image.

12. The wearable data entry system according to claim 10, wherein the set of one or more detection parameters includes a length of the data collection period used in the detecting, and the length of the data collection period used by the at least one process for detecting which fingers contacted the arbitrary surface changes in accordance with a change in the stored mode value.

13. The wearable data entry system according to claim 10, wherein the set of one or more detection parameters includes a number of fingers for which corresponding signals are analyzed, and the number of fingers for which corresponding signals are analyzed changes in accordance with a change in the stored mode value.

14. The wearable data entry system according to claim 10, wherein the predetermined transmission protocol used by the transmitter is one of (i) a custom Bluetooth profile, (ii) a Bluetooth HID keyboard profile, (iii) a Bluetooth HID gamepad profile, and (iv) a Bluetooth MIDI profile, and the predetermined transmission protocol used by the transmitter changes in accordance with a change in the stored mode value.

15. The wearable data entry system according to claim 10, wherein the at least one processor is configured to receive a mode command from the external device and to change the mode value stored in the memory in accordance with the received mode command.

16. The wearable data entry system according to claim 10, wherein the information transmitted by the transmitter is the data generated by the at least one processor indicating which fingers contacted the arbitrary surface.

17. The wearable data entry system according to claim 10, wherein the at least one processor maps the data indicating which fingers contacted the arbitrary surface into other information, wherein the memory stores a plurality of look up tables and the at least one processor performs the mapping using one of the stored look up tables in accordance with the stored mode value, and wherein the information transmitted by the transmitter is the other information resulting from the mapping by the at least one processor.

18. The wearable data entry system according to claim 10, wherein the at least one processor is configured to receive one or more signals from another wearable data entry system worn on another hand and generates data indicating which fingers of both hands contacted the arbitrary surface.

19. The wearable data entry system according to claim 10, wherein the one or more sensors, the at least one processor, the transmitter, and the memory are integrated into a wearable supporting substrate having five holes for respective fingers of the user's hand.

20. The wearable data entry system according to claim 10, wherein the at least one processor is configured to change the mode value stored in the memory in accordance with detecting a particular combination of fingers contacting the arbitrary surface.

* * * * *